US006849533B2

(12) United States Patent
Chang et al.

(10) Patent No.: US 6,849,533 B2
(45) Date of Patent: Feb. 1, 2005

(54) METHOD FOR FABRICATING MICROELECTRONIC PRODUCT WITH ATTENUATED BOND PAD CORROSION

(75) Inventors: Chih-Kung Chang, Hsin-Chu (TW); Yu-Kung Hsiao, Tao-Yuan (TW); Sheng-Liang Pan, Hsin-Chu (TW); Fu-Tien Wong, Hsin-Chu (TW); Chin-Chen Kuo, Taipei (TW); Chung-Sheng Hsiung, Hsinchu (TW); Hung-Jen Hsu, Taoyuan (TW); Yi-Ming Dai, Hsin-Chu (TW); Po-Wen Lin, Chia-i (TW); Te-Fu Tseng, Hsin-Chu (TW)

(73) Assignee: Taiwan Semiconductor Manufacturing Co., LTD, Hsin Chu (TW)

( * ) Notice: Subject to any disclaimer, the term of this patent is extended or adjusted under 35 U.S.C. 154(b) by 0 days.

(21) Appl. No.: 10/354,697

(22) Filed: Jan. 29, 2003

(65) Prior Publication Data

US 2004/0147105 A1 Jul. 29, 2004

(51) Int. Cl.$^7$ .............................................. H01L 21/44
(52) U.S. Cl. ........................ 438/612; 438/618; 438/622; 438/624; 438/29

(58) Field of Search ................................. 438/612, 618, 438/622, 624, 637, 26, 27, 28, 29, 22, 24, 46, 47, 627, 632, 643, 646, 653, 688; 257/88, 780, 89, 751, 752, 765

(56) References Cited

U.S. PATENT DOCUMENTS

| | | | | |
|---|---|---|---|---|
| 5,654,202 A | * | 8/1997 | Daly et al. ..................... | 438/70 |
| 5,792,374 A | * | 8/1998 | Yang et al. .................... | 216/24 |
| 6,063,207 A | * | 5/2000 | Yu et al. ........................ | 134/2 |
| 6,338,976 B1 | | 1/2002 | Huang et al. | |
| 6,344,369 B1 | * | 2/2002 | Huang et al. .................. | 438/70 |

FOREIGN PATENT DOCUMENTS

EP          0959505 A2 * 11/1999     ....... H01L/31/0216

* cited by examiner

Primary Examiner—Maria F. Guerrero
(74) Attorney, Agent, or Firm—Tung & Associates

(57) ABSTRACT

A method for fabricating a microelectronic product provides for forming a planarizing layer upon a bond pad and a topographic feature, both formed laterally separated over a substrate. The planarizing layer is formed with a diminished thickness upon the bond pad such that it may be readily etched to expose the bond pad while employing as a mask an additional layer formed over the topographic feature but not over the bond pad. The method is particularly useful for forming color filter sensor image array optoelectronic products with attenuated bond pad corrosion.

17 Claims, 2 Drawing Sheets

METHOD FOR FABRICATING MICROELECTRONIC PRODUCT WITH ATTENUATED BOND PAD CORROSION

BACKGROUND OF THE INVENTION

1. Field of the Invention

The present invention relates generally to methods for fabricating microelectronic products. More particularly, the present invention relates to methods for fabricating microelectronic products with attenuated bond pad corrosion.

2. Description of the Related Art

Microelectronic products encompass both purely electronic products as well as optoelectronic products. Examples of purely electronic microelectronic products typically include, but are not limited to, semiconductor integrated circuit products and ceramic substrate products. Examples of optoelectronic microelectronic products typically include, but are not limited to: (1) solar cell products; and (2) image array products (such as but not limited to sensor image array products and display image array products).

Common to all microelectronic products, whether purely electronic products or optoelectronic products, is the use of bond pads for connecting and interconnecting circuits and devices within microelectronic products.

While bond pads are thus often essential within microelectronic products, bond pads are nonetheless not entirely without problems.

In that regard, bond pads within optoelectronic products often have an enhanced susceptibility to corrosion due to photoelectric effects.

The present invention is thus directed towards the goal of fabricating optoelectronic products with attenuated bond pad corrosion.

Various methods have been disclosed for fabricating optoelectronic products with desirable properties.

Included among the methods, but not limiting among the methods, are methods disclosed within Huang et al., in U.S. Pat. No. 6,338,976 (a method for fabricating an optoelectronic microelectronic product with attenuated bond pad corrosion).

Desirable are additional methods for fabricating optoelectronic products with attenuated bond pad corrosion.

It is towards the foregoing object that the present invention is directed.

SUMMARY OF THE INVENTION

A first object of the invention is to provide a method for fabricating an optoelectronic product.

A second object of the present invention is to provide a method in accord with the first object of the invention, where the optoelectronic product is fabricated with attenuated bond pad corrosion.

In accord with the objects of the present invention, the present invention provides a method for fabricating a microelectronic product.

To practice the method of the present invention, there is first provided a substrate. There is then formed over the substrate a bond pad laterally separated from a topographic feature. There is then formed upon the bond pad and the topographic feature a planarizing layer which planarizes the topographic feature but is formed with a diminished thickness upon the bond pad. There is then formed over the planarizing layer at least one additional layer formed over the topographic feature but not over the bond pad. Finally, there is then etched the planarizing layer to expose the bond pad while employing the at least one additional layer as a mask.

The present invention provides a method for fabricating a microelectronic product with attenuated bond pad corrosion.

The invention realizes the foregoing object by forming a planarizing layer upon both a topographic feature and a bond pad, both formed laterally separated over a substrate employed within a microelectronic product. Within the invention, the planarizing layer is formed with a diminished thickness upon the bond pad such that it may be readily etched to expose the bond pad while employing as a mask an additional layer formed over the topographic feature but not over the bond pad.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for fabricating a microelectronic product with attenuated bond pad corrosion.

The invention realizes the foregoing object by forming a planarizing layer upon both a topographic feature and a bond pad, both formed laterally separated over a substrate employed within a microelectronic product. Within the invention, the planarizing layer is formed with a diminished thickness upon the bond pad such that it may be readily etched to expose the bond pad while employing as a mask an additional layer formed over the topographic feature but not over the bond pad.

Although the preferred embodiment illustrates the present invention within the context of forming a color filter sensor image array optoelectronic product with attenuated bond pad corrosion, the present invention is not intended to be so limited. Rather, the present invention provides value under circumstances where: (1) a bond pad formed within a microelectronic product may be exposed to various processing materials; and (2) the bond pad may be passivated with a planarizing layer employed for planarizing a topographic feature laterally separated from the bond pad. The topographic feature may be formed from materials including but not limited to conductor materials, semiconductor materials, dielectric materials and laminates thereof. Thus, in general, the invention may be employed for fabricating microelectronic products including but not limited to purely electronic products (whose operation is based upon processing of electrical signals only) and optoelectronic products (whose operations is based upon processing of both electrical and optical signals).

FIG. 1 to FIG. 9 shown a series of schematic cross-sectional diagrams illustrating the results of progressive stages of fabricating, in accord with a preferred embodiment of the present invention, a color filter sensor image array optoelectronic product.

Figure 1:
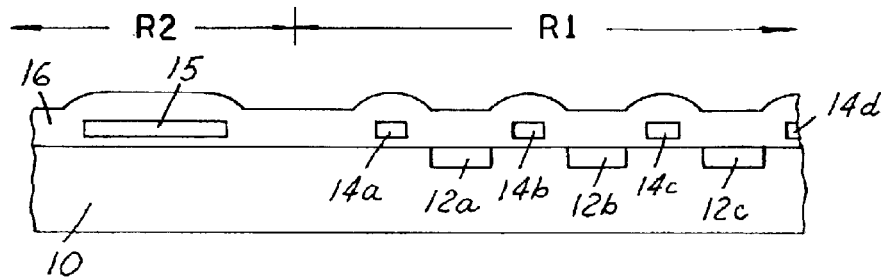
FIG. 1, FIG. 2, FIG. 3, FIG. 4, FIG. 5, FIG. 6, FIG. 7, FIG. 8 and FIG. 9 show a series of schematic cross-sectional diagrams illustrating the results of progressive stages of fabricating, in accord with a preferred embodiment of the present invention, a color filter sensor image array optoelectronic product.

FIG. 1 shows a schematic cross-sectional diagram of the color filter sensor image array optoelectronic product at an early stage in its fabrication in accord with the present invention.

Within FIG. 1, a substrate 10 is divided into an active region R1 and a peripheral region R2. Within the active region R1, the substrate 10 has formed therein a series of photoactive regions 12a, 12b and 12c.

Within the invention, the substrate 10 is typically and preferably a silicon semiconductor substrate, and the series of photoactive regions 12a, 12b and 12c is typically and preferably a series of photodiode regions within the silicon semiconductor substrate. However, the present invention may provide value with respect to an optoelectronic product which employs a substrate other than a silicon semiconductor substrate, where the substrate has formed therein, thereupon or thereover photoactive regions formed of other than photodiodes. Typically, the silicon semiconductor substrate will have an N- or P-doping concentration, while the photodiode photoactive regions 12a, 12b and 12c will have a complementary P+ or N+ doping concentration.

Although FIG. 1 illustrates the substrate 10 as a flat substrate having the photoactive regions 12a, 12b and 12c formed contiguously therein, the photoactive regions 12a, 12b and 12c may also be formed topographically within the substrate 10. Similarly, the substrate 10 may also have formed therein additional appropriate layers and structures, such as but not limited to channel stop layers and structures, as are needed to adequately isolate the photoactive regions 12a, 12b and 12c within the substrate 10.

FIG. 1 also shows a blanket dielectric passivation layer 16 formed upon the substrate 10, including the series of photoactive regions 12a, 12b and 12c. A series of patterned conductor layers 14a, 14b, 14c and 14d is formed within the blanket dielectric passivation layer 16 over the active region R1 of the substrate 10, at locations alternating with the series of photo active regions 12a, 12b and 12c. A bond pad 15 is formed within the blanket dielectric passivation layer 16 within the peripheral region R2 of the substrate 10. Within the present invention, the series of patterned conductor layers 14a, 14b, 14c and 14d, as well as the bond pad 15, may typically be formed incident to patterning of a single blanket conductor layer, although such is not a requirement within the present invention.

Within the present invention, the series of patterned conductor layers 14a, 14b, 14c and 14d typically serves as a first directional charge collection array (within a bidirectional array which is not otherwise illustrated). Similarly, the bond pad 15 is one of a series of bond pads which is ultimately connected to various of the series of patterned conductor layers 14a, 14b, 14c or 14d for purposes of extracting and sensing charge therefrom incident to illumination of the series of photoactive regions 12a, 12b and 12c. Finally, the blanket dielectric passivation layer 16 serves to separate the patterned conductor layers 14a, 14b, 14c and 14d, and the bond pad 15, from each other and from the substrate 10. As is illustrated within FIG. 1, the series of patterned conductor layers 14a, 14b, 14c and 14d, induces within the blanket dielectric passivation layer 16 a series of topographic features (i.e., composite patterned conductor layer and dielectric layer features) for which planarization is desired.

Within the present invention, the bond pad 15 and the patterned conductor layers 14a, 14b, 14c and 14d are each typically formed of an aluminum or aluminum alloy (having an aluminum content of greater than about 96~99 weight percent aluminum) conductor material. Typically, each of the patterned conductor layers 14a, 14b, 14c and 14d and the bond pad 15 is formed to a thickness of from about 4000 to about 8000 angstroms. Typically, each of the patterned conductor layers 14a, 14b, 14c and 14d has a minimum linewidth of from about 0.2 to about 0.4 microns while the bond pad 15 has a bidirectional linewidth (i.e., defining a plan view area) of from about 70 to about 100 microns.

Within the present invention, the blanket dielectric passivation layer 16 is typically formed of a dielectric passivation material which is transparent to incident electromagnetic radiation intended for detection and classification by the color filter sensor image array optoelectronic product illustrated in FIG. 1. Typically, the blanket dielectric passivation layer 16 is formed of a passivation material selected from the group including but not limited to silicon oxide passivation materials, silicon nitride passivation materials, silicon oxynitride passivation materials and composites thereof, having incorporated therein the series of patterned conductor layers 14a, 14b, 14c and 14d, and the bond pad 15. Typically, the blanket dielectric passivation layer 16 is formed to a thickness of from about 15000 to about 20000 angstroms, having formed therein peak-to-trough topographic feature variations of from about 1000 to about 3000 angstroms, which are desired to be planarized.

Figure 2:
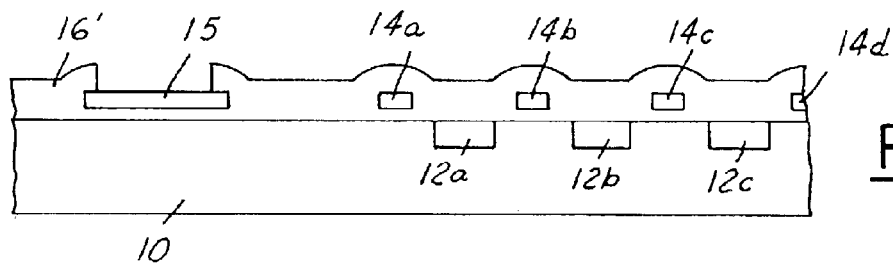

FIG. 2 shows the results of further processing of the color filter sensor image array optoelectronic product of FIG. 1.

FIG. 2 shows the results of etching the blanket dielectric passivation layer 16 to form an etched blanket dielectric passivation layer 16' which leaves exposed a surface of the bond pad 15. Such etching may be effected while employing photolithographic methods and etchant materials as are conventional in the art of microelectronic fabrication. Typically, the etched blanket dielectric passivation layer 16' edge passivates the bond pad 15, as illustrated in FIG. 2.

Figure 3:
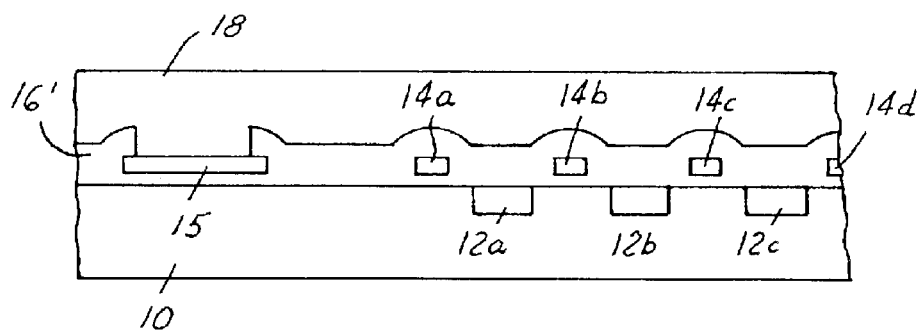

FIG. 3 illustrates the results of further processing of the color filter sensor image array optoelectronic product of FIG. 2.

FIG. 3 illustrates the results of forming a blanket planarizing layer 18 upon exposed portions of the etched blanket dielectric passivation layer 16' and the bond pad 15.

Within the present invention, the blanket planarizing layer 18 is formed of a photoresist planarizing material, preferably a negative photoresist planarizing material having a generally enhanced photosensitivity. Other planarizing materials, including positive photoresist planarizing materials, may also be employed within the invention. The negative photoresist planarizing material may be of a variety as is conventional or unconventional in the art of microelectronic fabrication. Examples of appropriate conventional negative photoresist planarizing materials include, but are not limited to, CT-3050L by Fuji Film Arch., negative photoresist planarizing materials. Typically, the blanket planarizing layer 18 is formed to a thickness of from about 15000 to about 25000 angstroms.

Figure 4:
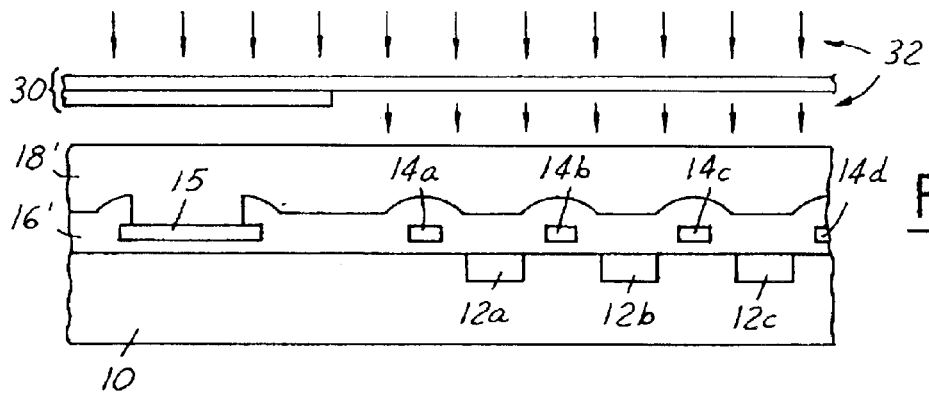

FIG. 4 shows the results of further processing of the color filter sensor image array optoelectronic product of FIG. 3.

FIG. 4 shows the results of partially photoexposing the blanket planarizing layer 18, while employing a photomask 30 in conjunction with a first actinic radiation dose 32, to provide a partially photoexposed blanket planarizing layer 18'. The partially photoexposed blanket planarizing layer 18' is nominally unexposed over the bond pad 15. Such photoexposure is otherwise generally conventional in the art of microelectronic fabrication and is intended to fully photoexpose illuminated portions of the partially photoexposed blanket planarizing layer 18' (i.e., portions other than over the bond pad 15). Typically, such photoexposure will be from about 50 to about 150 millijoules per square centimeter.

Figure 5:
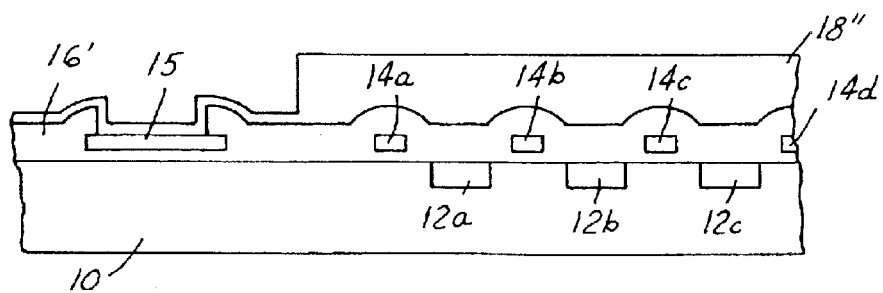

FIG. 5 shows the results of further processing of the color filter sensor image array optoelectronic product of FIG. 4.

FIG. 5 shows the results of incompletely developing the photoexposed blanket planarizing layer 18' to form an incompletely developed photoexposed blanket planarizing layer 18" having a greater thickness over the topographic features within the active region R1 of the substrate 10 than over the bond pad 15 within the peripheral region R2 of the substrate 10.

Within FIG. 5, the thickness of the incompletely developed photoexposed blanket planarizing layer 18" upon the bond pad 15 is typically from about 100 to about 700 angstroms and more typically from about 200 to about 400 angstroms. The thickness of the incompletely developed photoexposed blanket planarizing layer 18" upon the topographic features within the active region R1 of the substrate 10 is typically from about 15000 to about 25000 angstroms, as noted above. The photoexposed blanket planarizing layer 18' is incompletely developed to form the incompletely developed photoexposed blanket planarizing layer 18" by employing development conditions (i.e., developer time, temperature or concentration) which adequately provide for accurately incompletely developing the photoexposed blanket planarizing layer 18'.

Figure 6:
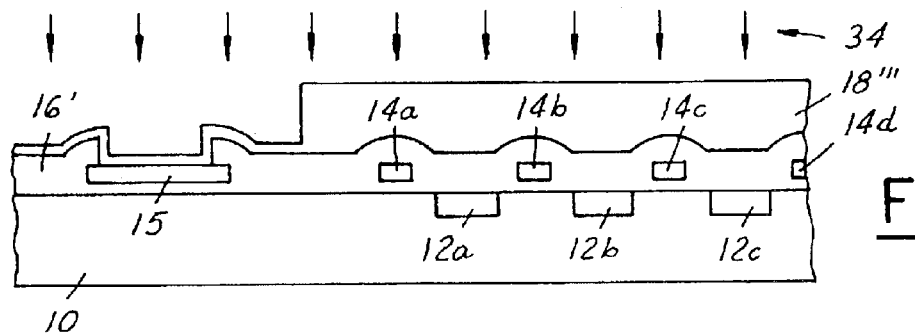

FIG. 6 shows the results of further processing of the color filter sensor image array optoelectronic product of FIG. 5.

FIG. 6 shows a second actinic radiation dose 34 which further photoexposes the incompletely developed photoexposed blanket planarizing layer 18" to form therefrom an incompletely developed twice photoexposed blanket planarizing layer 18'''.

The second actinic radiation dose 34 is provided employing conditions generally similar to the first actinic radiation dose 32, such as to fully photoexpose the portion of the incompletely developed twice photoexposed blanket planarizing layer 18" formed upon the bond pad 15. Typically, such a photoexposure will be from about 40 to about 800 millijoules per square centimeter, more preferably from about 60 to about 120 millijoules per square centimeter.

Figure 7:
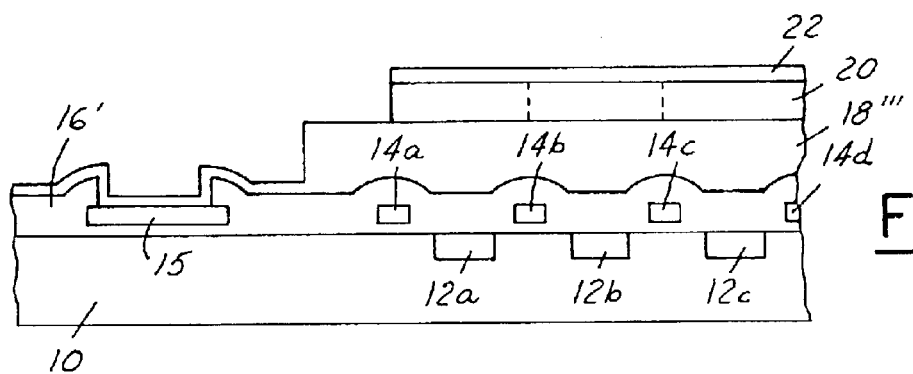

FIG. 7 shows the results of further processing of the color filter sensor image array optoelectronic product of FIG. 6.

FIG. 7 shows the results of forming a color filter layer 20 upon the incompletely developed twice photoexposed blanket planarizing layer 18''' within the active region R1 of the substrate 10 but not over the bond pad 15 within the peripheral region R2 of the substrate 10. In addition, FIG. 7 also illustrates a spacer layer 22 formed aligned upon the color filter layer 20.

Within the present invention, each of the color filter layer 20 and the spacer layer 22 may be formed employing methods and materials as are conventional in the art of color filter sensor image array optoelectronic product fabrication.

Although not specifically illustrated within FIG. 7, the color filter layer 20 typically comprises multiple patterned color layers, as are conventional in the art of color filter sensor image array optoelectronic product fabrication. Typically, the color filter layer 20 is formed of an organic polymer binder material (generally a photopolymer) having incorporated therein separate sections of color filter materials which encompass either the three primary colors of red, blue and green or the three complementary primary colors of cyan, magenta and yellow. Fabrication of the color filter layer 20 thus generally requires multiple coating and partial stripping process steps to form a series of patterned color filter layers. In absence of the thinned portion of the incompletely developed twice photoexposed blanket planarizing layer 18''' formed upon the bond pad 15, the bond pad 15 would otherwise generally be exposed to multiple cycles of process chemicals when forming the color filter layer 20. Such chemical exposure often accelerates corrosion of the bond pad 15. Typically, the color filter layer 20 is formed to a thickness of from about 10000 to about 20000 angstroms.

Within the present invention, the spacer layer 22 is preferably formed of a material which is intended to separate a series of patterned microlens layers from the color filter layer 20. Similarly with the blanket dielectric passivation layer 16 and the blanket planarizing layer 18, the spacer layer 22 is preferably formed of a spacer material which is transparent to a spectrum of incident electromagnetic radiation whose detection and classification is effected by the color filter sensor image array optoelectronic microelectronic product whose schematic diagram is illustrated in FIG. 7. Also similarly with the blanket dielectric passivation layer 16, the spacer layer 22 is preferably formed from a spacer material selected from the group including but not limited to silicon oxide materials, silicon nitride materials, silicon oxynitride materials. Typically, the spacer layer 22 is formed to a thickness of from about 15000 to about 25000 angstroms.

Figure 8:
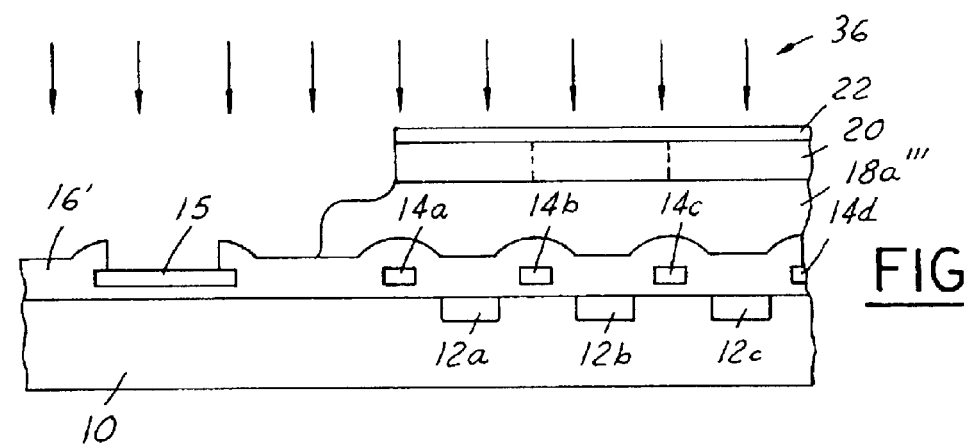

FIG. 8 shows the results of further processing of the color filter sensor image array optoelectronic product of FIG. 7.

FIG. 8 illustrates an etching of the incompletely developed twice photoexposed blanket planarizing layer 18''' with an etching plasma 36, while employing the spacer layer 22 as a mask, to form an etched incompletely developed twice photoexposed blanket planarizing layer 18a''' which leaves exposed the bond pad 15.

Within the invention, the etching plasma 36 is typically an oxygen containing etching plasma, such as to efficiently strip the thinned portion of the incompletely developed twice photoexposed blanket planarizing layer 18''' formed upon the bond pad 15 when forming the etched incompletely developed twice photoexposed planarizing layer 18a'''. Within the present invention, the oxygen containing etchant plasma will typically employ an oxygen etchant gas, although other oxygen containing etchant gases may also be employed. Typically, the etching plasma 36 also employs: (1) a reactor chamber pressure of from about 500 to about 8000 mtorr; (2) a radio frequency power of from about 500 to about 15000 watts; (3) an oxygen flow rate of from about 100 to about 5000 standard cubic centimeters per minute (sccm); and (4) an etching plasma treatment time of from about 2 to about 30 seconds, more preferably from about 5 to about 15 sccm.

Figure 9:
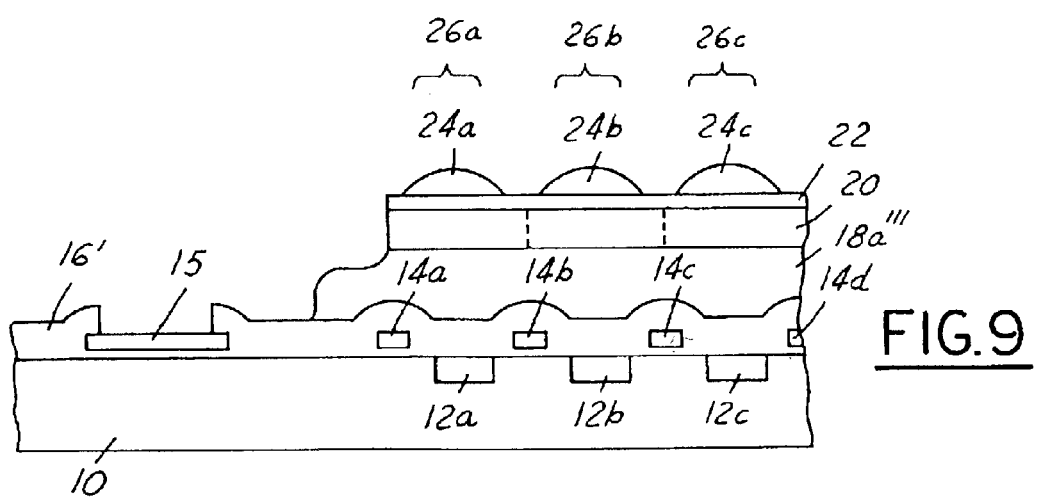

FIG. 9 shows the results of further processing of the color filter sensor image array optoelectronic product of FIG. 8.

FIG. 9 shows a series of microlens layers 24a, 24b and 24c formed upon the spacer layer 22 and registered with each of the corresponding series of photoactive regions 12a, 12b and 12c.

Within the present invention, the series of microlens layers 24a, 24b and 24c may be formed employing methods and materials as are conventional in the art of color filter sensor image array optoelectronic product fabrication. Typically, each of the series of microlens layers 24a, 24b and 24c is formed of a reflowed patterned photoresist material layer or patterned organic polymer material layer of appropriate optical properties. Typically, the microlens layers 24a, 24b and 24c are formed as domes of diameter from about 3 to about 14 microns and thickness from about 5000 to about 30000 angstroms.

As is illustrated within FIG. 9, each portion of the color filter sensor image array optoelectronic product which includes a patterned microlens layer 24a, 24b or 24c, in conjunction with a corresponding photoactive region 12a, 12b and 12c, comprises a pixel element 26a, 26b or 26c.

The color filter sensor image array optoelectronic product of FIG. 9 has attenuated bond pad 15 corrosion since during a portion of its fabrication the bond pad 15 has formed thereupon a thinned portion of a planarizing layer as a sacrificial protective layer.

The preferred embodiment of the present invention is illustrative of the present invention rather than limiting of the present invention. Revisions and modifications may be made to methods, materials, structures and dimensions which are employed to fabricate a color filter sensor image array optoelectronic microelectronic product in accord with the preferred embodiment of the present invention, while providing a method for fabricating a microelectronic product, or in particular an optoelectronic microelectronic product, in accord with the present invention, further in accord with the appended claims.

What is claimed is:

1. A method for fabricating a microelectronic product comprising:
    providing a substrate;
    forming over the substrate a bond pad laterally separated from a topographic feature;
    forming upon the bond pad and the topographic feature a planarizing layer which planarizes the topographic feature but is formed with a diminished thickness upon the bond pad;
    forming over the planarizing layer at least one additional layer formed over the topographic feature but not over the bond pad; and
    etching the planarizing layer to expose the bond pad while employing the at least one additional layer as a mask.

2. The method of claim 1 wherein the microelectronic product is selected from the group consisting of purely electronic products and optoelectronic products.

3. The method of claim 1 wherein the topographic feature is selected from the group consisting of conductor features, semiconductor features, dielectric features and laminates thereof.

4. The method of claim 1 wherein the planarizing layer is formed to a thickness of from about 15000 to about 25000 angstroms upon the topographic feature and from about 100 to about 700 angstroms upon the bond pad.

5. The method of claim 1 wherein the planarizing layer is formed of a negative photoresist material.

6. The method of claim 5 wherein the diminished thickness of the planarizing layer upon the bond pad is formed through an incomplete development of a portion of the negative photoresist material.

7. A method for fabricating an optoelectronic microelectronic product comprising:
    providing a substrate having formed therein a photoactive region;
    forming over the substrate a bond pad laterally separated from a topographic feature;
    forming upon the bond pad and the topographic feature a planarizing layer which planarizes the topographic feature but is formed with a diminished thickness upon the bond pad;
    forming over the planarizing layer at least one additional layer formed over the topographic feature but not over the bond pad; and
    etching the planarizing layer to expose the bond pad while employing the at least one additional layer as a mask.

8. The method of claim 7 wherein the optoelectronic microelectronic product is selected from the group consisting of sensor image array optoelectronic products and display image array optoelectronic products.

9. The method of claim 7 wherein the topographic feature is selected from the group consisting of conductor features, semiconductor features, dielectric features and laminates thereof.

10. The method of claim 7 wherein the planarizing layer is formed to a thickness of from about 15000 to about 25000 angstroms upon the topographic feature and from about 100 to about 700 angstroms upon the bond pad.

11. The method of claim 7 wherein the planarizing layer is formed of a negative photoresist material.

12. The method of claim 11 wherein the diminished thickness of the planarizing layer upon the bond pad is formed through an incomplete development of a portion of the negative photoresist material.

13. A method for fabricating a color filter sensor optoelectronic microelectronic product comprising:
    providing a substrate having formed therein a photoactive region;
    forming over the substrate a bond pad laterally separated from a topographic feature;
    forming upon the bond pad and the topographic feature a planarizing layer which planarizes the topographic feature but is formed with a diminished thickness upon the bond pad;
    forming over the planarizing layer a spacer layer formed over the topographic feature but not over the bond pad; and
    etching the planarizing layer to expose the bond pad while employing the spacer layer as a mask.

14. The method of claim 13 wherein the topographic feature is selected from the group consisting of conductor features, semiconductor features, dielectric features and laminates thereof.

15. The method of claim 13 wherein the planarizing layer is formed to a thickness of from about 15000 to about 25000 angstroms upon the topographic feature and from about 100 to about 700 angstroms upon the bond pad.

16. The method of claim 13 wherein the planarizing layer is formed of a negative photoresist material.

17. The method of claim 16 wherein the diminished thickness of the planarizing layer upon the bond pad is formed through an incomplete development of a portion of the negative photoresist material.

* * * * *